United States Patent [19]

Huang

[11] Patent Number: 4,963,504

[45] Date of Patent: Oct. 16, 1990

[54] METHOD FOR FABRICATING DOUBLE IMPLANTED LDD TRANSISTOR SELF-ALIGNED WITH GATE

[75] Inventor: Tiao-Yuan Huang, Cupertino, Calif.

[73] Assignee: Xerox Corporation, Stamford, Conn.

[21] Appl. No.: 428,155

[22] Filed: Nov. 24, 1989

Related U.S. Application Data

[62] Division of Ser. No. 123,693, Nov. 23, 1987, Pat. No. 4,907,048.

[51] Int. Cl.$^5$ ............................................. H01L 21/265
[52] U.S. Cl. ........................................ 437/44; 437/41; 437/186; 437/191; 437/192; 437/228; 437/229; 437/233; 156/643
[58] Field of Search ................... 437/41, 44, 233, 228, 437/229, 186, 191; 357/28.3, 23.4; 156/643, 653

[56] References Cited

U.S. PATENT DOCUMENTS 4,818,715   4/1989   Chao ...................................... 437/44
4,837,180   6/1989   Chao ...................................... 437/44

OTHER PUBLICATIONS

Huang et al., "A Novel Submicron LDD Transistor with Inverse-T Gate Structure", IEDM, 12/1986, pp. 742–745.
Wolf et al., Silicon Processing for the VLSI Era, vol. 1, Process Technology, Lattice Press, 1986, pp. 397–399.

Primary Examiner—Olik Chaudhuri
Assistant Examiner—M. Wilczewski
Attorney, Agent, or Firm—Serge Abend

[57] ABSTRACT

An improved double implanted and aligned LDD transistor comprising a gate having a central alignment member and a pair of outboard alignment members having portions contiguous with the gate oxide layer. A lightly doped junction is aligned with the central alignment member and a heavily doped junction is aligned with the outboard alignment members.

15 Claims, 1 Drawing Sheet

METHOD FOR FABRICATING DOUBLE IMPLANTED LDD TRANSISTOR SELF-ALIGNED WITH GATE

This is a division of application Ser. No. 07/123,693, filed Nov. 23, 1987, now U.S. Pat. No. 4,907,048.

FIELD OF THE INVENTION

The present invention relates to an improved LDD transistor which avoids spacer induced degradations and exhibits reduced hot-electron effects and short-channel effects, and to several methods for its fabrication.

BACKGROUND OF THE INVENTION

Recently, semiconductor device miniaturization has been driven toward smaller and smaller devices, in the sub-micron range, by means of advanced silicon fabrication technologies. As this miniaturization trend continues toward higher integration density in VLSIs and improved performance, the devices approach physical limits predicted by operating principles. For example, since reduction in device dimensions is not usually accompanied by a corresponding reduction in source-to-drain voltage, higher electric fields can be expected to be generated across the channel. Therefore, in devices with an effective channel length of 1 $\mu$m or less, simply scaling down the device dimensions, without changing the supply voltage, generally results in deteriorated performance and often cuases device failure. In order to overcome degraded performance, various constraints are imposed on device design.

One of the most important problems to overcome in realizing submicron VLSIs is the hot-electron effects. On the one hand, it is desirable to decrease the channel length in order to obtain faster devices and to increase packing density. On the other hand, unless reduction in device dimensions is accompanied by a corresponding reduction in the supply voltage, higher electric fields will be generated in the substrate. Such intensified electric fields cause deterioration in device reliability. Alternatively, suitable design modifications may be introduced into the device to overcome or mitigate the effect of the intensified electric field.

It is well known that one of the severest limitations imposed on the miniaturization of transistorss in VLSIs is the very high electric field across the channel, which causes hot-carrier injection into the gate oxide. Under the influence of the very high electric field, carriers (electrons or holes) originating from the channel current, which gain sufficient energy, may be injected into the gate oxide in the vicinity of the drain. These trapped carriers cause device instabilities, such as threshold voltage shift and transconductance degradation.

The device illustrated in FIG. 1 represents a conventional transistor 10 wherein n+ implanted source 12 and drain 14 junction regions in semiconductor substrate 16 are self aligned with gate 18 located upon a thin gate oxide layer 20. (It should be understood that although I will be referring almost exclusively to n doped regions, p doping is also comprehended.) Absent a reduction in the supply voltage, the likelihood of the above-described hot-electron effects is increased as dimensions are reduced and the source and drain get closer.

One solution that has been successful in reducing the electric field peak has been the addition of lightly doped n− regions between the n+ regions and the channel which cause some of the channel electric field to drop therein. In recent years various device processes, such as double-diffused drain (DDD) and lightly-doped drain (LDD), have been developed to incorporate the n− regions. These have been widely studied to ascertain their effect on alleviating hot-electron effects in short channel n-type MOSFETs. It should be noted that although the nomenclature of these design techniques refers to changes in the drain region, the MOSFET devices are generally symmetrical and the similar changes are made in both the source and drain regions.

A device 22 made by the DDD fabrication method is illustrated in FIG. 2. It includes a semiconductor substrate 24 upon which are deposited a thin gate oxide 26, such as $SiO_2$, and a conductive semiconductor gate 28, which may be made of polycrystalline silicon (polysilicon or poly). The source and drain junction regions each include a first lightly doped (n−) implant 30 of a fast diffusing material, such as phosphorus, which is self aligned with the edge of gate 28, which serves as a mask for this purpose. The source and drain also include a second, more heavily doped (n+) implant 32 of a slower diffusing material, such as arsenic, which is also self aligned with the same edge of the gate 28. After the dopant implants have been introduced, a long (1 hour), high temperature (>1000° C.), drive-in is utilized to diffuse the dopant materials into the substrate and to electrically activate them. Because of their differential rates of diffusion, the faster diffusing phosphorus will be driven deeper into the substrate and also will be driven laterally further beneath the gate than the slower diffusing arsenic.

Studies of the DDD devices indicate that while they are satisfactory in some respects, i.e. they do reduce somewhat the channel electric field $E_{max}$, their inherently deeper junctions, caused by the dopant being driven downwardly into the substrate, degrade the short channel effects by causing punchthrough and threshold voltage falloff of the transistor. The length ($L_{n-}$) of the n− buffer region 30 between the n+ junction 32 and the channel region 34 should be accurately controlled to precisely modify the channel electric field $E_{max}$. However, this is not possible with this technique because it relies upon the diffusion of atoms for locating their rest positions. Furthermore, while the electrical field may be reduced by interposition of a lightly doped region, this technique inherently requires high dopant doses in the n− region in order to allow the remote diffusion to occur.

The LDD device 36, shown in FIG. 3, was developed to overcome the disadvantages of the DDD. It includes a semiconductor substrate 38 upon which is deposited a gate oxide layer 40 and a gate 42. Lightly doped, n− source and drain junctions 44 are implanted into the substrate to be self aligned with the edges of the gate 42 which serves as a mask. Then, insulating outboard spacers 46, preferably made of $SiO_2$ are deposited adjacent the gate to define $L_{n-}$, and the heavily doped n+ source and drain junctions 48 are implanted into the substrate 38 to be self aligned with the outboard edges of the spacers 46. It can be seen that the resultant structure has certain similarities with the DDD, particulary in the location of the n− region. However, a high drive in temperature is not needed because $L_{n-}$ is set by the spacer width and may be accurately controlled.

Studies of the LDD devices also indicate a critical defect in this structure, attributable to the remote location of the n+ junction from the edge of the gate. This defect mechanism, known as spacer induced degradation, causes electrons to be trapped in the oxide of the n−/SiO$_2$ spacer interface and induces a positive charge adjacent the surface of the n− at that interface. The positive charge causes a high series resistance and prevents depletion of the n− region. As a possible cure for this defect, it has been suggested to increase the dopant dose in the n− region. However, doing so would cause the n− region to be very similar to the n+ region and the channel electric field would not be lowered significantly. Another suggested cure has been the introduction of a long, high temperature drive-in step to laterally drive the n+ into closer alignment with the gate edge. Unfortunately, this will also drive the n− regions deeper and closer together, further reducing the channel length and increasing the short-channel effects.

It is the object of the present invention to provide a MOSFET design which provides self alignments for both n+ and n− source-drain implants while avoiding spacer induced degradations.

It is a further object of this invention to provide a MOSFET design which offers an excellent structure for CMOS processes in which minimum thermal processing is necessary.

SUMMARY OF THE INVENTION

The LDD transistor of my invention may be constructed, in one form, by providing a semiconductor substrate supporting a gate oxide layer and gate/mask means, wherein the gate/mask means includes a central alignment means and an outboard alignment means, the outboard alignment means being contiguous with the gate oxide layer. Lightly doped source and drain regions have their facing ends in alignment with side walls of the central alignment means and heavily doped source and drain regions have their facing ends in alignment with side walls of the outboard alignment means.

DESCRIPTION OF THE PREFERRED EMBODIMENTS

Figure 1:
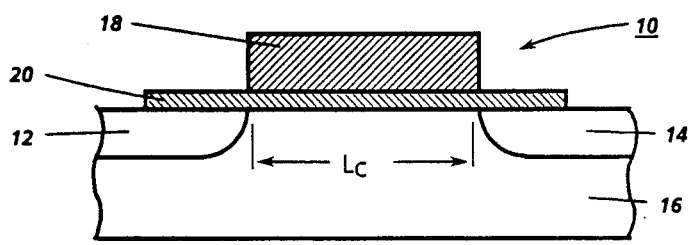
FIG. 1 is a side sectional view of a conventional single implant MOSFET device.
Figure 2:
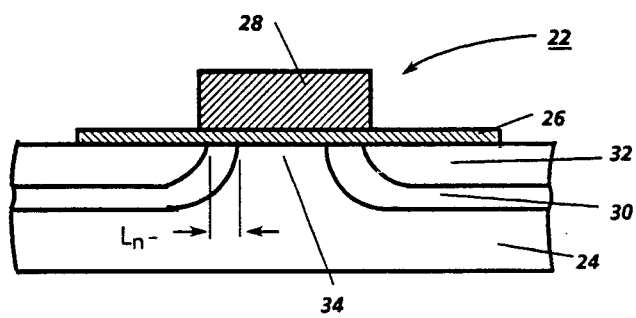
FIG. 2 is a side sectional view of a conventional double-diffused drain, double implanted MOSFET device.
Figure 3:
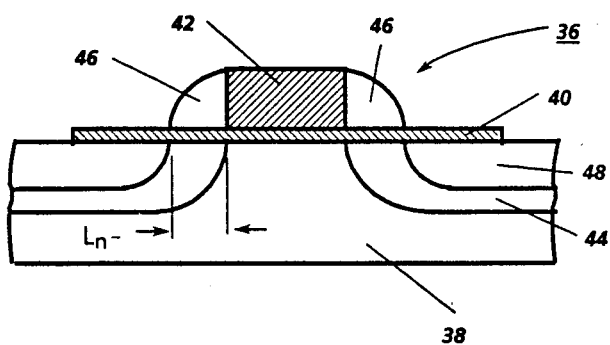
FIG. 3 is a side sectional view of a conventional lightly-doped drain, double implanted MOSFET device.

In FIGS. 4, 6, 7 and 8 there are illustrated several embodiments of my invention. In the transistor of each embodiment, the substrate 50 has implanted therein lightly doped n− source and drain regions 52, establishing a channel 54, and heavily doped n+ source and drain regions 56. A gate insulating layer 58 overlies the substrate. I have uniquely designed the gates to mask the dopant implantation process so as to accurately establish the length $L_{n-}$ of the lightly doped implant and to prevent spacer induced degradation. Clearly, optimizing the implant locations and the junction depth is critical for the device designer. As the dimension $L_{n-}$ is increased, the maximum electric field ($E_{max}$) and the likelihood of the hot electron effect decreases. However, this increase in length also carries with it a higher overlap capacitance which slows the device.

In these configurations of my device, the dopant profile can be simply and accurately controlled without resorting to a thermal drive-in step. Annealing serves two functions in device processing with regard to dopant implants. It is used to alter the dopant profile both laterally and in depth, and it electrically activates the implanted ions. In the process of my invention, accurate dopant profiles are achieved by the selection of appropriate masking and implantation energy, so that annealing is only required for dopant activation. Therefore, rapid thermal annealing (RTA) may be accomplished, by subjecting the device to a very high temperature for a very short time, e.g., 1000° C. for 10 seconds. This step will not enable significant diffusion to occur. Thus, my process is compatible with CMOS fabrication, in which both n and p channel devices are formed upon the same wafer, because the p-type dopant, boron, is a faster diffuser than the n-type dopants, arsenic or phosphorus. It should be clear that as applied to a CMOS wafer, a lower temperature anneal would be required for the p-type devices. The RTA parameters of time and temperature are insufficient to appreciably drive even the boron.

Figure 4:
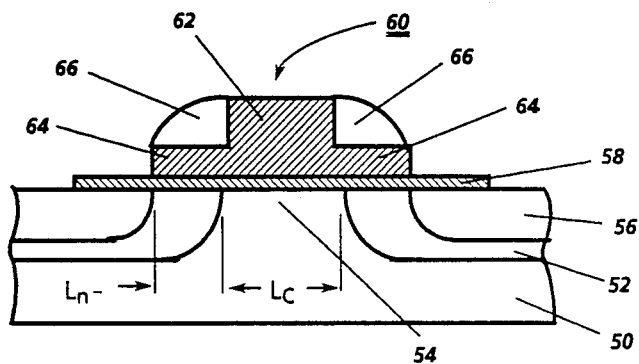
FIG. 4 is a side sectional view of an inverse-T gate LDD transistor device, in accordance with my invention.

The device of FIG. 4 includes a gate/mask 60 upon the thin oxide layer 58, in the form of an inverse T. It comprises a thick central trunk 62, whose width is selected to define the length ($L_C$) of the channel 54, and a pair of thin outboard legs 64, the trunk and legs being made of conductive material, preferably a heavily doped silicon. Insulating spacers 66, preferably made of SiO$_2$, overlie the thin outboard legs 64, thereby adding substantial thickness to those portions.

A series of essential fabrication steps for making the transistor device of FIG. 4 is illustrated in FIGS. 5a through 5f.

Figure 5A:
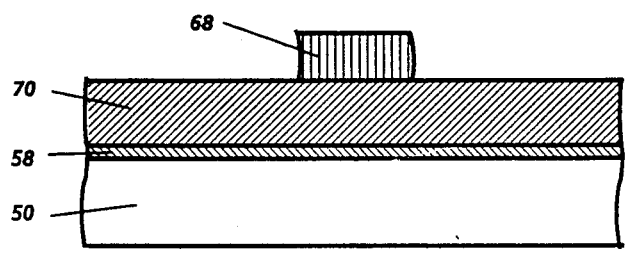
FIGS. 5a through 5f show the salient process steps in the fabrication of the device of FIG. 4.

FIG. 5a: a photoresist pattern 68 has been deposited upon a conductive layer 70 overlying the thin gate oxide layer 58 atop substrate 50. The layer 70 is preferably a heavily doped silicon, in either the polysilicon, microcrystalline or amorphous form and about 3500 Å thick.

Figure 5B:
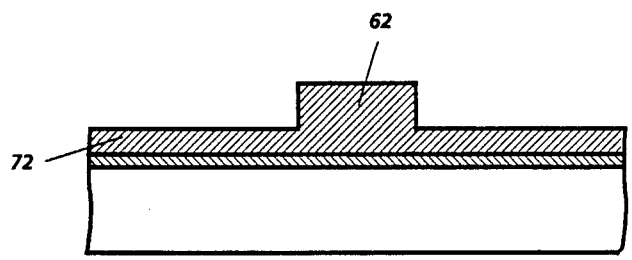

FIG. 5b: layer 70 is partially removed, as by etching, leaving a thick central trunk 62. Instead of removing the entire layer, as for a conventional LDD transistor, it is thinned to leave an outboard layer 72 of about 200 to 1000 Å. Care must be taken so as not to overthin the conductive layer.

Figure 5C:
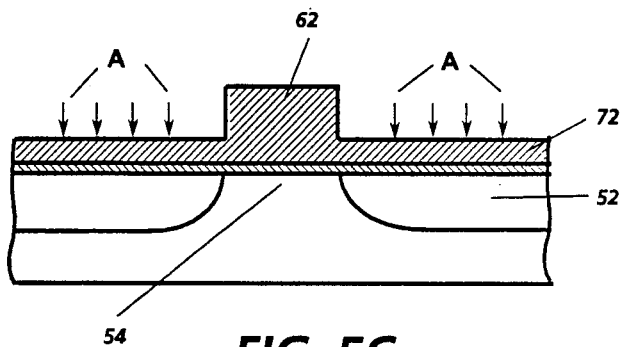

FIG. 5c: if an n-type device is desired, a phosphorus (n−) dose is implanted through the outboard layer 72, as indicated by arrows A, to form the lightly doped junctions 52. Implantation may not occur through the thick central trunk 62 which serves to mask the channel region 54.

Figure 5D:
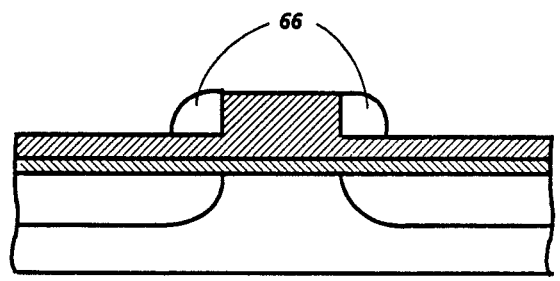

FIG. 5d: sidewall spacers 66 are formed by depositing an insulating layer, such as CVD $SiO_2$, and anisotropically etching it so that the outboard extent of the spacers defines the length $L_{n-}$.

Figure 5E:
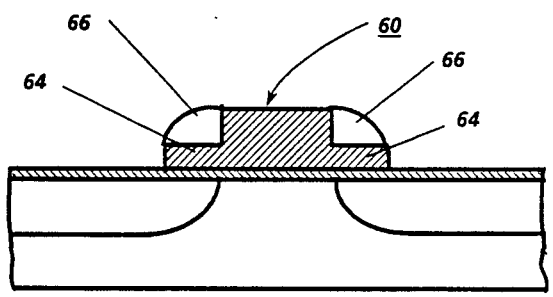

FIG. 5e: the extent of layer 72 outboard of sidewall spacers 66 may then be removed, leaving outboard legs 64. This completes the definition of the inverse-T gate structure 60.

Figure 5F:
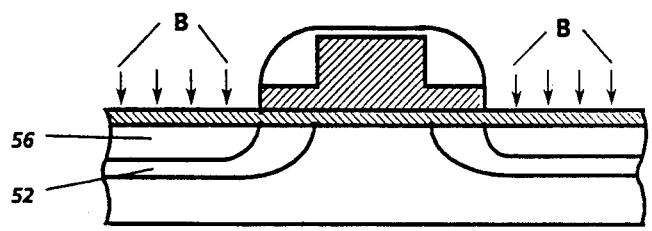

FIG. 5f: The sidewall spacers 66 atop the outboard legs 64 serve as masks to offset the arsenic (n+) dose, implanted as indicated by arrows B, to form the heavily doped junctions 56. Of course, it should be understood that the n+ implant may be made through the thinned layer 72, and that its extent outboard of the sidewall spacers may be removed as a final step, rather than as described with respect to FIG. 5e.

It should be noted that unlike the conventional LDD, the n+ source/drain implants are self-aligned to the polysilicon gate, eliminating an n+-to-gate offset which gives rise to spacer induced degradations. In contrast to the conventional DDD structure, which normally requires an additional n− drive-in to achieve an approximation of a desired $L_{n-}$ dimension, the optimum $L_{n-}$ dimension is readily set, by determining the width of the oxide sidewall spacer 66 (I have made the sidewall spacer 0.22 μm). No post implant drive-in is required and dopant activation may be effected by rapid thermal anneal (RTA). The application of minimum thermal energy allows the junctions to be shallow and the dopant redistribution to be substantially nonexistent, insuring high punch-through immunity.

Figure 6:
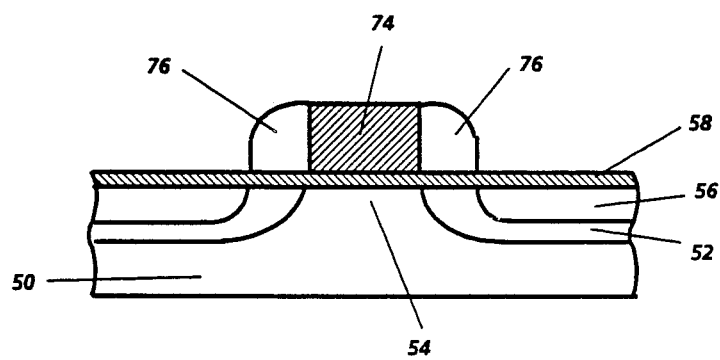
FIG. 6 is a side sectional view of an LDD transistor device with a conductive spacer, in accordance with my invention.

In the alternative embodiment illustrated in FIG. 6 the gate/mask comprises a central conductive trunk 74 flanked by conductive sidewall spacers 76, both of which may be doped polysilicon. The conductive sidewall spacers effectively extend the gate laterally outwardly so that the self-aligned n+ junctions 56 are aligned to the gate.

Figure 7:
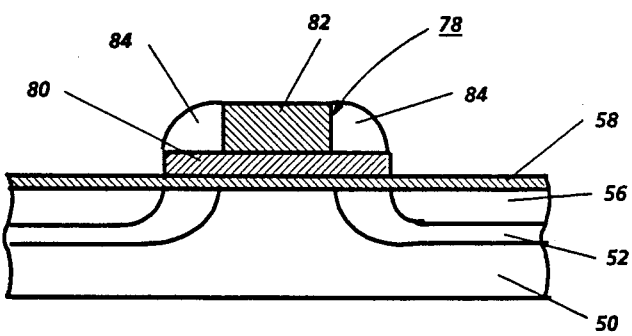
FIG. 7 is a side sectional view of an inverse-T gate LDD transistor device having a stacked gate, in accordance with my invention.

The fabrication process may be improved by the modification of forming the gate as a stack of different materials so as to provide inherent etch stops. Even in the preferred FIG. 4 embodiment, great care must be taken to avoid overthinning of the outboard legs 64 when layer 70 is etched. To this end, I propose the structures illustrated in FIGS. 7 and 8. In FIG. 7 the gate stack 78 comprises a thin conductive base layer 80, such as doped polysilicon, upon which may be formed a thick central trunk 82 of another conductive material, such as metal or a silicide. Selection of an appropriate differential etchant will remove only the trunk material and stop at the thin polysilicon. After the n− junction has been implanted through the thin conductive base layer 80, the oxide sidewall spacers 84 will have been added and the n+ junctions will have been implanted in alignment with the sidewall spacers. Alternatively, the thick central trunk 82 may be made of an insulating material, such as $SiO_2$ or $Si_3N_4$, in which case it will be necessary to open a contact to the lower thin conductive base layer 80.

Figure 8:
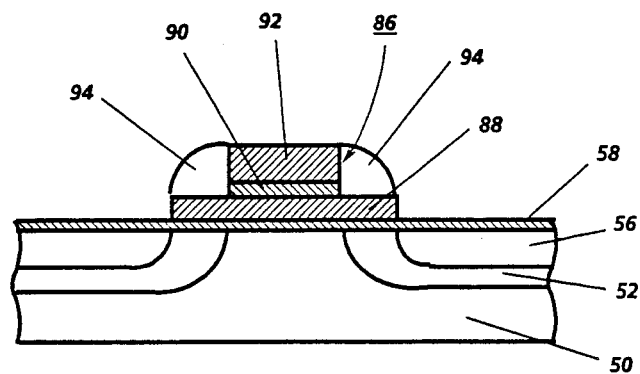
FIG. 8 is a side sectional view of an inverse-T gate LDD transistor device having a sandwiched stacked gate, in accordance with my invention.

In FIG. 8, the gate stack 86 comprises a thin conductive base layer 88 upon which is formed a thin central dielectric layer 90, such as an oxide or a nitride, and another central conductive layer 92. The sandwiched dielectric layer 90 serves as a differential etch stop. In this manner, by selecting an appropriate first differential etchant, it is possible to stop the top layer (92) etch at the dielectric layer interface, and then to change to a second differential etchant to remove the dielectric layer without thinning of the thin conductive base layer 88. As in the FIG. 7 embodiment, after the n− junction has been implanted, the insulating sidewall spacers 94 will have been added and the n+ junctions will have been implanted. If the sandwiched dielectric layer 90 is too thick, and the gate voltage would drop across it to an unacceptable level, the sidewall spacers 94 may be formed of a conductive material so that the gate voltage applied to the top conductive layer 92 of the gate will be bridged to the outboard thin conductive base layer 88.

Figure 9A:
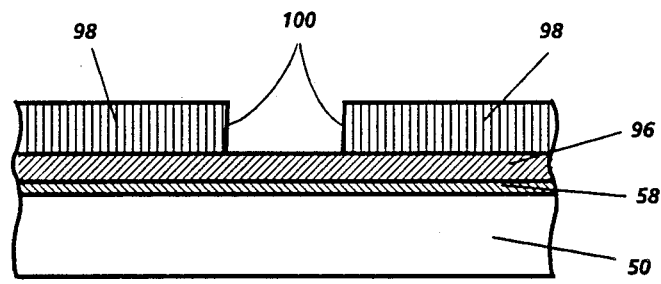
FIGS. 9a and 9b show the preliminary process steps of an alternate method for producing the inverse-T gate LDD transistor device shown in FIG. 7.
Figure 9B:
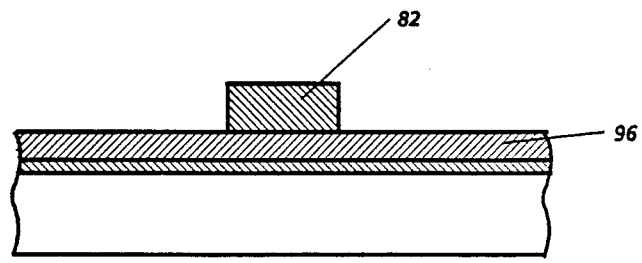

Another fabrication option for the formation of the central trunk portion of FIG. 7 device is the lift-off method illustrated in FIGS. 9a and 9b. In this method, the substrate 50 supports the thin oxide layer 58 and a thin conductive layer 96. A negatively patterned photoresist layer 98 is deposited upon the conductive layer, leaving a notch 100. Then, a layer of metal is uniformly deposited to the desired thickness. The wafer is then treated with an appropriate solution to remove the photoresist and simultaneously lift off the metal deposited upon its surface, leaving the central trunk 82. This double step is shown in FIG. 9b. Subsequent processing follows the same steps illustrated in FIGS. 5c through 5f.

Figure 10:
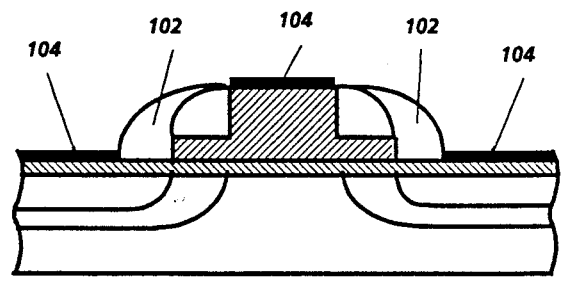
FIG. 10 is a side sectional view of the inverse-T gate LDD transistor device of FIG. 4 having been SALICIDED.

In order to reduce the series resistance of the transistor it is well known to silicide the gate, source and drain by the SALICIDING (self aligned siliciding) technique. My proposed LDD structure is compatible with SALICIDING. This may be accomplished, as illustrated in FIG. 10, by adding a second insulating spacer 102, such as $SiO_2$ and then depositing a thin layer of titanium. After a suitable thermal anneal at about 600° C., a highly conductive layer of titanium silicide 104 is formed over the silicon gate, source and drain. A titanium nitride (annealing usually takes place in a nitrogen ambient atmosphere) layer is formed upon the insulating spacers. A suitable solution is used to strip the TiN. In fact, siliciding the gate is actually not necessary, if the central conductive layer is a refractory metal or a silicide material. By using a separate $SiO_2$ spacer for siliciding source and drain, the silicided source-drain can be offset from the n+/n− interface. This would be very beneficial in easing the current crowding and relieving the high electric field (which would otherwise exists at the n+/n− interface in conventional SALICIDING), thus easing the aggravated hot-electron effects and electrostatic discharge (ESD) damage observed when conventional SALICIDING is used with a single $SiO_2$ spacer.

For those who are interested in a more complete review of the experimental results of my invention, the following published papers are hereby incorporated by reference: "A Novel Submicron LDD Transistor With Inverse-T Gate Structure" Huang et al, published in the Proceedings of the International Electron Devices Meeting, Los Angeles, CA, Dec. 7-10, 1986; "A New LDD Transistor With Inverse-T Gate Structure" Huang et al, published in IEEE Electron Device Letters, Vol. EDL-8, No. 4, Apr. 1987; and "Eliminating Spacer-Induced Degradations in LDD Transistors" Huang et al, published in the 3rd International Symposium on VLSI Technology, Systems and Applications, May 1987.

It should be understood that the present disclosure has been made only by way of examples and that numerous other changes in details of construction and the combination and arrangement of elements, as well as other fabrication steps and their sequence of implementation, may be resorted to, without departing from the true spirit and scope of the invention as hereinafter claimed.

What is claimed:

1. A method for fabricating LDD transistor devices comprising the steps of:
   providing a semiconductor substrate of a first conductivity type,
   forming a gate insulating film on said semiconductor substrate,
   forming a thin conductive layer upon said gate insulating film,
   forming a thick alignment member upon said thin conductive layer,
   doping said substrate to a first impurity concentration through said thin conductive layer, in alignment with said thick alignment member, with an impurity having a conductivity type opposite to that of said semiconductor substrate, so as to form a first doped region,
   depositing sidewall spacers upon said thin conductive layer on either side of said thick alignment member,
   doping said substrate to a second impurity concentration, higher than said first impurity concentration, in alignment with said sidewall spacers, with an impurity having a conductivity type opposite to that of said semiconductor substrate, so as to form a second doped region
   removing portions of said thin conductive layer outboard of said sidewall spacers, and
   thermally treating the substrate for electrically activating said impurities.

2. The method as defined in claim 1 characterized in that said step of removing is performed before said step of doping said substrate to a second conductivity.

3. The method as defined in claim 1 characterized in that said step of removing is performed after said step of doping said substrate to a second conductivity.

4. The method as defined in claim 2 characterized in that said dopants are electrically activated by rapid thermal annealing.

5. The method as defined in claim 3 characterized in that said dopants are electrically activated by rapid thermal annealing.

6. The method as defined in claim 1 characterized in that said steps of forming a thin conductive layer and forming a thick alignment member comprise: depositing a first conductive layer whose thickness is the same as said thin conductive layer, upon said gate insulating film; depositing plural layers having differential etch characteristics to an aggregate thickness which is the same as said thick alignment member, the layer adjacent to said first conductive layer having an etch characteristic different from said first conductive layer; masking the surface of said plural layers in the area to be formed into said thick alignment member; and sequentially totally removing the unmasked portions of said surface layer and the layers thereunder, by means of different etchants, in areas outboard of said thick alignment member, stopping at said thin conductive layer.

7. The method as defined in claim 1 characterized in that said steps of forming a thin conductive layer and forming a thick alignment member comprise: depositing a conductive layer whose thickness is the same as said thick alignment member, upon said gate insulating film; masking said conductive layer in the area to be formed into said thick alignment member; and removing portions of said unmasked conductive layer on either side of said thick alignment member.

8. The method as defined in claim 1 characterized in that said steps of forming a thin conductive layer and forming a thick alignment member comprise: depositing a first conductive layer whose thickness is the same as said thin conductive layer, upon said gate insulating film; depositing a second conductive layer whose thickness is the same as said thick alignment member; masking said second conductive layer in the area to be formed into said thick alignment member; and totally removing portions of said unmasked second conductive layer outboard of said thick alignment member.

9. The method as defined in claim 1 characterized in that said steps of forming a thin conductive layer and forming a thick alignment member comprise: depositing a conductive layer whose thickness is the same as said thin conductive layer, upon said gate insulating film; depositing an insulating layer whose thickness is the same as said thick alignment member; masking said insulating layer in the area to be formed into said thick alignment member; and totally removing portions of said unmasked insulating layer outboard of said thick alignment member.

10. The method as defined in claim 1 characterized in that said steps of forming a thin conductive layer and forming a thick alignment member comprise: depositing a first conductive layer whose thickness is the same as said thin conductive layer, upon said gate insulating film; masking said first conductive layer with a negatively patterned photoresist layer having a notch whose dimensions are equal to the dimensions of said thick alignment member; depositing a second conductive layer whose thickness is the same as said thick alignment member over said photoresist layer; and lifting off said photoresist layer bearing said second conductive layer, so as to leave said thick alignment member upon said first conductive layer.

11. The method as defined in claim 6 characterized in that a silicide layer is formed on the surface of said thick alignment member and the substrate surface of said second doped region.

12. The method as defined in claim 7 characterized in that a silicide layer is formed on the surface of said thick alignment member and the substrate surface of said second doped region.

13. The method as defined in claim 8 characterized in that a silicide layer is formed on the surface of said thick alignment member and the substrate surface of said second doped region.

14. The method as defined in claim 9 characterized in that a silicide layer is formed on the surface of said thick alignment member and the substrate surface of said second doped region.

15. The method as defined in claim 10 characterized in that a silicide layer is formed on the surface of said thick alignment member and the substrate surface of said second doped region.

* * * * *